(12) United States Patent
Sugiura et al.

(10) Patent No.: US 10,143,083 B2
(45) Date of Patent: Nov. 27, 2018

(54) SUBSTRATE FOR PRINTED CIRCUIT BOARD AND METHOD FOR PRODUCING SUBSTRATE FOR PRINTED CIRCUIT BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Motohiko Sugiura, Osaka (JP); Takashi Kasuga, Osaka (JP); Yoshio Oka, Osaka (JP); Shigeaki Uemura, Osaka (JP); Jinjoo Park, Koka (JP); Hiroshi Ueda, Koka (JP); Kousuke Miura, Koka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/536,954

(22) PCT Filed: Dec. 18, 2015

(86) PCT No.: PCT/JP2015/085454
§ 371 (c)(1),
(2) Date: Jun. 16, 2017

(87) PCT Pub. No.: WO2016/104347
PCT Pub. Date: Jun. 30, 2016

(65) Prior Publication Data
US 2017/0347449 A1 Nov. 30, 2017

(30) Foreign Application Priority Data
Dec. 22, 2014 (JP) .................................. 2014-259518

(51) Int. Cl.
H05K 1/09 (2006.01)
H05K 3/20 (2006.01)
(Continued)

(52) U.S. Cl.
CPC ........... *H05K 1/097* (2013.01); *H05K 1/0298* (2013.01); *H05K 1/03* (2013.01); *H05K 1/05* (2013.01);
(Continued)

(58) Field of Classification Search
CPC ............ H05K 3/20; H05K 1/09; H05K 1/092; H05K 1/095; H05K 1/097
See application file for complete search history.

(56) References Cited

U.S. PATENT DOCUMENTS

| 4,572,764 A * | 2/1986 | Fan ...................... H05K 3/0023 156/235 |
| 2005/0224253 A1* | 10/2005 | Aoki ...................... H05K 3/246 174/256 |

(Continued)

FOREIGN PATENT DOCUMENTS

| JP | 2012-114152 A | 6/2012 |
| JP | 2014-141083 A | 8/2014 |

(Continued)

*Primary Examiner* — Jeremy C Norris
(74) *Attorney, Agent, or Firm* — Drinker Biddle & Reath LLP

(57) ABSTRACT

A substrate for a printed circuit board according to an embodiment of the present invention includes a base film having an insulating property, and a metal layer formed on at least one surface side of the base film. In the substrate for a printed circuit board, a plurality of fine particles are disposed between the base film and the metal layer, and the fine particles are formed of a metal the same as a main metal of the metal layer or formed of a metal compound of the main metal. The fine particles preferably have an average particle size of 0.1 nm or more and 20 nm or less. The fine (Continued)

particles are preferably formed of a metal oxide or a metal hydroxide. The fine particles are preferably present between the base film and the metal layer so as to form a layer. The metal layer preferably includes a metal grain layer formed by firing metal nanoparticles.

7 Claims, 9 Drawing Sheets

(51) Int. Cl.
  *H05K 3/24* (2006.01)
  *H05K 3/38* (2006.01)
  *H05K 1/02* (2006.01)
  *H05K 1/03* (2006.01)
  *H05K 1/05* (2006.01)
  *B82Y 30/00* (2011.01)
  *B82Y 40/00* (2011.01)

(52) U.S. Cl.
  CPC .................. *H05K 1/09* (2013.01); *H05K 3/24* (2013.01); *H05K 3/38* (2013.01); *B82Y 30/00* (2013.01); *B82Y 40/00* (2013.01)

(56) References Cited

U.S. PATENT DOCUMENTS

| | | | |
|---|---|---|---|
| 2009/0136770 A1 | 5/2009 | Hirakoso et al. | |
| 2012/0031656 A1* | 2/2012 | Oka | ........................ C23C 28/00 174/257 |
| 2017/0127516 A1* | 5/2017 | Kasuga | .................. H05K 1/092 |

FOREIGN PATENT DOCUMENTS

| | | |
|---|---|---|
| WO | WO-2008/013002 A1 | 1/2008 |
| WO | WO-2010-122918 A1 | 10/2010 |

* cited by examiner

SUBSTRATE FOR PRINTED CIRCUIT BOARD AND METHOD FOR PRODUCING SUBSTRATE FOR PRINTED CIRCUIT BOARD

TECHNICAL FIELD

The present invention relates to a substrate for a printed circuit board and a method for producing a substrate for a printed circuit board.

BACKGROUND ART

Substrates for printed circuit boards are widely used, the substrates each including an insulating base film and a metal layer disposed on a surface of the base film and being used for obtaining a printed circuit board by etching the metal layer to form a conductive pattern.

There has been a demand for a substrate for a printed circuit, the substrate having high peel strength between a base film and a metal layer so that the metal layer does not separate from the base film when folding force is applied to a printed circuit board formed by using the substrate for a printed circuit board.

In view of this, a technology relating to a substrate that is formed by laminating a copper foil forming a metal layer on a surface of a polyimide base film has been proposed in which the peel strength between the base film and the metal layer is increased by adjusting a ten-point mean roughness (Rz) of a surface of the copper foil, the surface being bonded to the base film, to be in a range of 0.7 to 2.2 µm (refer to PTL 1).

CITATION LIST

Patent Literature

PTL 1: Japanese Unexamined Patent Application Publication No. 2014-141083

SUMMARY OF INVENTION

Technical Problem

In the substrate disclosed in the above patent application publication, since the bonding surface of the copper foil has irregularities, projecting portions on the surface of the copper foil are engaged in the inside of the base film. Such portions engaged in the inside of the base film are difficult to remove by etching. In order to remove the metal engaged in the base film, it is necessary to increase the concentration of an etchant or increase the etching time. However, when a conductive pattern is formed by etching with an etchant having a high concentration or by conducting etching for a long time, the resulting circuit shape is significantly tapered due to side etching. Thus, the substrate disclosed in the patent application publication has a poor conductive pattern-forming property.

The metal layer of the substrate disclosed in the above patent application publication has irregularities on a surface bonded to the base film. Accordingly, when high frequencies are propagated in a conductive pattern formed by etching the metal layer, a current that is concentrated near the surface by the skin effect flows along the irregularities on the bonding surface. As a result, the length of a substantial transmission path of the current increases, resulting in a problem of an increase in the loss accordingly. Therefore, it is desirable to provide a method for improving the peel strength between a base film and a metal layer, the method having a configuration different from that of the substrate disclosed in the above patent application publication.

The present invention has been made in view of the circumstances described above. An object of the present invention is to provide a substrate for a printed circuit board, the substrate having a good etching property and high peel strength between a base film and a metal layer, and a method for producing such a substrate for a printed circuit board.

Solution to Problem

A substrate for a printed circuit board according to an embodiment of the present invention, which has been made to solve the problems described above, includes a base film having an insulating property, and a metal layer formed on at least one surface side of the base film. In the substrate for a printed circuit board, a plurality of fine particles are disposed between the base film and the metal layer, and the fine particles are formed of a metal the same as a main metal of the metal layer or formed of a metal compound of the main metal.

A method for producing a substrate for a printed circuit board according to another embodiment of the present invention, which has been made to solve the problems described above, is a method for producing a substrate for a printed circuit board, the substrate including a base film having an insulating property, and a metal layer formed on at least one surface side of the base film. The method includes a step of applying a conductive composition containing metal nanoparticles onto one surface side of the base film, and a step of firing the applied conductive composition. In the method, the firing step includes a step of forming a plurality of fine particles between the base film and the metal layer, the fine particles being formed of a metal the same as a main metal of the metal layer or formedof a metal compound of the main metal.

Advantageous Effects of Invention

The substrate for a printed circuit board according to an embodiment of the present invention has a good etching property and high peel strength between a base film and a metal layer. According to the method for producing a substrate for a printed circuit board according to another embodiment of the present invention, it is possible to produce a substrate for a printed circuit board, the substrate having a good etching property and high peel strength between a base film and a metal layer.

DESCRIPTION OF EMBODIMENTS

Figure 1:
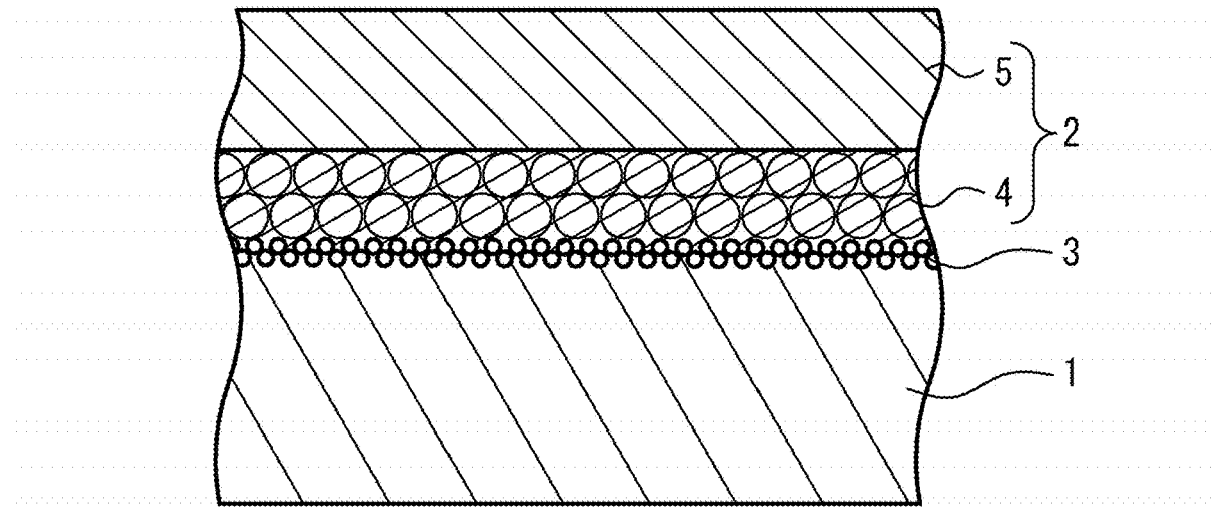
FIG. 1 is a schematic sectional view illustrating a substrate for a printed circuit board according to an embodiment of the present invention.

[Description of Embodiments of the Present Invention]

A substrate for a printed circuit board according to an embodiment of the present invention includes a base film having an insulating property, and a metal layer formed on at least one surface side of the base film. In the substrate for a printed circuit board, a plurality of fine particles are disposed between the base film and the metal layer, and the fine particles are formed of a metal the same as a main metal of the metal layer or formed of a metal compound of the main metal.

In the substrate for a printed circuit board, since a plurality of fine particles formed of a metal the same as a main metal of the metal layer or formed of a metal compound of the main metal are disposed between the base film and the metal layer, peel strength between the base film and the metal layer is improved. The reason for this is assumed to be as follows, though details thereof are unclear. The fine particles can be bonded to a metal that forms the metal layer and are easily bonded to a resin or the like that forms the base film. Accordingly, the fine particles disposed so as to fill the gap between the metal layer and the base film improve the peel strength between the metal layer and the base film. In addition, this configuration in which the peel strength is increased by the fine particles disposed between the base film and the metal layer does not deteriorate an etching property of the metal layer. Therefore, the substrate for a printed circuit board has a good conductive pattern-forming property.

The fine particles preferably have an average particle size of 0.1 nm or more and 20 nm or less. When the fine particles thus have an average particle size in the above range, the peel strength between the base film and the metal layer can be more reliably improved.

The fine particles are preferably formed of a metal oxide or a metal hydroxide. When the fine particles are thus formed of a metal oxide or a metal hydroxide, a bonding property between the metal layer and the fine particles improves. Therefore, the peel strength between the base film and the metal layer can be more reliably improved.

The fine particles are preferably present between the base film and the metal layer so as to form a layer. When the fine particles are thus present between the base film and the metal layer so as to form a layer, the peel strength between the base film and the metal layer can be uniformly improved.

The metal layer preferably includes a metal grain layer formed by firing metal nanoparticles. When the metal layer thus includes a metal grain layer formed by firing metal nanoparticles, formation of the metal layer is facilitated. Since metal nanoparticles have a large surface area and easily react with surrounding substances, the metal nanoparticles easily generate fine particles.

The metal layer preferably further includes a plating layer on one surface side of the metal grain layer, the plating layer being formed by electroless plating or electroplating. When the metal layer thus further includes a plating layer on one surface side of the metal grain layer, the plating layer being formed by electroless plating or electroplating, the thickness or strength of the metal layer can be easily increased at a low cost.

The main metal is preferably copper. When the main metal is thus copper, a metal layer having a low electrical resistance can be formed at a low cost.

An oxygen content in a region of the base film, the region extending from a surface on the metal layer side to a depth of 50 nm, is preferably 20 atomic percent or more and 60 atomic percent or less. When an oxygen content in a region of the base film, the region extending from a surface on the metal layer side to a depth of 50 nm, is in the above range, the peel strength between the base film and the metal layer can be further improved.

A method for producing a substrate for a printed circuit board according to another embodiment of the present invention, the substrate including a base film having an insulating property, and a metal layer formed on at least one surface side of the base film, includes a step of applying a conductive composition containing metal nanoparticles onto one surface side of the base film, and a step of firing the applied conductive composition. In the method, the firing step includes a step of forming a plurality of fine particles between the base film and the metal layer, the fine particles being formed of a metal the same as a main metal of the metal layer or formed of a metal compound of the main metal.

According to the method for producing a substrate for a printed circuit board, in a firing step of firing metal nanoparticles in the presence of a very small amount of oxygen to from a metal layer, the firing step being performed after an application step of a conductive composition containing the metal nanoparticles, a plurality of fine particles are formed between the base film and the metal layer, the fine particles being formed of a metal the same as a main metal of the metal layer or formed of a metal compound of the main metal. Accordingly, these fine particles can improve the peel strength between the base film and the metal layer. These fine particles are assumed to be formed in the firing step as a result of diffusion of the metal nanoparticles into the base film by heat and reaction of the diffused metal nanoparticles with a very small amount of oxygen. In addition, since the fine particles do not deteriorate an etching property of the metal layer, the conductive pattern-forming property can be reliably ensured. Therefore, the method for producing a substrate for a printed circuit board realizes production of a substrate for a printed circuit board, the substrate having a good etching property and high peel strength between the base film and the metal layer.

Herein, the term "fine particle" refers to a particle whose shape is confirmed by electron microscopy. The fine particle may be one formed of a plurality of particulate substances that are connected together. The term "main metal" of the metal layer refers to a metal having the highest content in terms of the number of atoms among metals that form the metal layer near the fine particles (the distance from a fine particle is 10 times or less the average particle size of the fine particles). The term "average particle size" refers to a value determined by measuring particle sizes of 10 or more particles on a sectional image taken with a transmission electron microscope (TEM), and averaging the particle sizes. The term "oxygen content" refers to a content in terms of the number of atoms measured by energy-dispersive X-ray spectroscopy (EDX). The term "surface of a base film" refers to a boundary surface of a region in which the molecular structure serving as the skeleton (for example, a carbon chain in the case of a resin) of a base film is present.

[Details of Embodiments of the Present Invention]

A substrate for a printed circuit board according to embodiments of the present invention will be described in detail with reference to the drawings.

[Substrate for Printed Circuit Board]

A substrate for a printed circuit board illustrated in FIG. 1 includes a base film 1 having an insulating property and a metal layer 2 formed on at least one surface side of the base film 1. The substrate for a printed circuit board is used for obtaining a printed circuit board by forming a conductive pattern by a method including a step of etching the metal layer 2. Examples of the specific method for forming the conductive pattern include a subtractive method and a semi-additive method.

The substrate for a printed circuit board includes a plurality of fine particles 3 disposed between the base film 1 and the metal layer 2. The fine particles 3 are present between the base film 1 and the metal layer 2 so as to form a layer.

<Base Film>

Examples of the material of the base film 1 include flexible resins such as polyimides, liquid-crystal polymers, fluororesins, polyethylene terephthalate, and polyethylene naphthalate; rigid materials such as paper impregnated with a phenolic resin, paper impregnated with an epoxy resin, glass composites, fiberglass cloths impregnated with an epoxy resin, Teflon (registered trademark), and glass base materials; and rigid-flexible materials that are composites of a hard material and a soft material. Among these, polyimides are preferred from the viewpoint of allowing the fine particles 3 to generate in a large amount and exhibiting high bonding strength to metal oxides or the like. Furthermore, particularly preferred are non-thermoplastic polyimides, which are unlikely to flow even in a step of firing metal nanoparticles and are capable of holding the fine particles 3 so as to form a layer.

Since the thickness of the base film 1 is determined in accordance with the specification of a printed circuit board produced by using the substrate for a printed circuit board, the thickness is not particularly limited. For example, the lower limit of the average thickness of the base film 1 is preferably 5 μm, and more preferably 12 μm. The upper limit of the average thickness of the base film 1 is preferably 2 mm, and more preferably 1.6 mm. When the average thickness of the base film 1 is less than the lower limit, the base film 1 may have insufficient strength. On the other hand, when the average thickness of the base film 1 exceeds the upper limit, a reduction in the thickness of the printed circuit board may become difficult to achieve.

The lower limit of the oxygen content in a region of the base film 1, the region extending from a surface on the metal layer 2 side to a depth of 50 nm, is preferably 20 atomic percent, and more preferably 22 atomic percent. The upper limit of the oxygen content in a region of the base film 1, the region extending from a surface on the metal layer 2 side to a depth of 50 nm, is preferably 60 atomic percent, and more preferably 50 atomic percent. When the oxygen content in a region of the base film 1, the region extending from a surface on the metal layer 2 side to a depth of 50 nm, is less than the lower limit, an improvement in the peel strength between the base film 1 and the metal layer 2 may be insufficient. On the other hand, when the oxygen content in a region of the base film 1, the region extending from a surface on the metal layer 2 side to a depth of 50 nm, exceeds the upper limit, the base film 1 may be easily broken.

In the base film 1, the surface on which the metal layer 2 is to be formed is preferably subjected to a hydrophilic treatment. Examples of the hydrophilic treatment include a plasma treatment for making a surface hydrophilic by irradiation with plasma and an alkali treatment for making a surface hydrophilic with an alkali solution. By subjecting the base film 1 to such a hydrophilic treatment, formation of the metal layer 2 described below (as a specific example, application of a conductive composition) is easily performed.

<Metal Layer>

The metal layer 2 includes a metal grain layer 4 formed by firing metal nanoparticles, and a plating layer 5 formed on one surface side (opposite to the base film 1) of the metal grain layer 4 by electroless plating or electroplating.

(Metal Grain Layer)

The metal grain layer 4 is formed by applying a conductive composition containing metal nanoparticles to one surface of the base film 1, and heat-treating the conductive composition, that is, firing the metal nanoparticles. When a section of this metal grain layer 4 is observed with a transmission electron microscope, crystal grains due to the metal nanoparticles are confirmed. These crystal grains are connected together by sintering and are no longer independent particles.

The lower limit of the average thickness of the metal grain layer 4 is preferably 0.05 μm, and more preferably 0.1 μm. The upper limit of the average thickness of the metal grain layer 4 is preferably 2 μm, and more preferably 1.5 μm. When the average thickness of the metal grain layer 4 is less than the lower limit, slits may be generated in the metal grain layer 4, which may result in a decrease in the conductivity. On the other hand, when the average thickness of the metal grain layer 4 exceeds the upper limit, a reduction in the thickness of the metal layer 2 may become difficult to achieve, or pores in the metal grain layer 4 may not be filled with a metal during formation of the plating layer 5 described below, which may result in insufficient conductivity and strength of the metal grain layer 4 and the metal layer 2.

The main metal of the metal nanoparticles that form the metal grain layer 4 is not particularly limited. However, in order to supply a metal element constituting fine particles 3 described below to the interface with the base film 1, the main metal is preferably a metal that generates a metal oxide due to the main metal or a group derived from the metal oxide, and a metal hydroxide due to the main metal or a group derived from the metal hydroxide. Examples of the preferred metal include copper, nickel, aluminum, gold, and silver. Among these, copper, which is inexpensive, has good conductivity, and has good adhesiveness with the base film 1, is particularly preferable.

The lower limit of the average particle size of the metal nanoparticles that form the metal grain layer 4 is preferably 1 nm, more preferably 10 nm, still more preferably 20 nm, and particularly preferably 30 nm. The upper limit of the average particle size of the metal nanoparticles is preferably 500 nm, and more preferably 100 nm. When the average particle size of the metal nanoparticles is less than the lower limit, dispersibility and stability of the metal nanoparticles in the conductive composition may decrease. On the other hand, when the average particle size of the metal nanoparticles exceeds the upper limit, the metal nanoparticles may tend to precipitate, and in the applied conductive composition, the density of the metal nanoparticles is unlikely to be uniform.

(Plating Layer)

The plating layer 5 is formed by electroless plating on a surface of the metal grain layer 4, the surface being opposite to the base film 1. Since the plating layer 5 is thus formed by electroless plating, gaps between the metal nanoparticles that form the metal grain layer 4 are filled with the metal of the plating layer 5. When the gaps are left in the metal grain layer 4, a fracture may occur from such a gap portion, and thus the metal grain layer 4 tends to separate from the base film 1. In contrast, since the gap portions are filled with the plating layer 5, separation of the metal grain layer 4 is prevented.

Examples of the metal used for the electroless plating include copper, nickel, and silver, all of which have a good conductivity. When copper is used for the metal nanoparticles that form the metal grain layer 4, copper or nickel is preferably used in consideration of adhesiveness to the metal grain layer 4.

The lower limit of the average thickness of the plating layer 5 formed by electroless plating is preferably 0.2 µm, and more preferably 0.3 µm. The upper limit of the average thickness of the plating layer 5 formed by electroless plating is preferably 1 µm, and more preferably 0.5 µm. When the average thickness of the plating layer 5 formed by electroless plating is less than the lower limit, the gap portions of the metal grain layer 4 may not be sufficiently filled with the plating layer 5, which may result in a decrease in the conductivity. On the other hand, when the average thickness of the plating layer 5 formed by electroless plating exceeds the upper limit, the time necessary for the electroless plating may increase, which may result in a decrease in the production efficiency.

Alternatively, after formation of a thin layer by electroless plating, electroplating is preferably further performed to form a plating layer 5 having a large thickness. By performing electroplating followed by electroless plating, the thickness of the metal layer can be adjusted easily and accurately, and the metal layer having a thickness necessary for forming a printed circuit can be formed in a relatively short time. Examples of the metal used for the electroplating include copper, nickel, and silver, all of which have a good conductivity.

The thickness of the plating layer 5 after the electroplating is determined in accordance with the type of printed circuit to be formed and is not particularly limited. For example, the lower limit of the average thickness of the plating layer 5 after the electroplating is preferably 1 µm, and more preferably 2 µm. The upper limit of the average thickness of the plating layer 5 after the electroplating is preferably 100 µm, and more preferably 50 µm. When the average thickness of the plating layer 5 after the electroplating is less than the lower limit, the metal layer 2 may have insufficient strength. On the other hand, when the average thickness of the plating layer 5 after the electroplating exceeds the upper limit, a reduction in the thickness of the substrate for a printed circuit board and the thickness of a printed circuit board produced by using the substrate for a printed circuit board may become difficult to achieve.

<Fine Particles>

A plurality of fine particles 3 disposed between the base film 1 and the metal layer 2 improve the peel strength, that is, the bonding strength between the base film 1 and the metal layer 2. In particular, since the fine particles 3 are present so as to form a layer, the peel strength between the base film 1 and the metal layer 2 can be uniformly improved. The fine particles 3 are confirmed as fine particles different from the base film 1 and the metal layer 2 when a section of the substrate for a printed circuit board is observed with a transmission electron microscope.

The fine particles 3 are formed of a metal the same as the main metal of the metal layer 2, that is, the main component of metal nanoparticles that form the metal grain layer 4 in a region near the fine particles of the metal layer 2, or formed of a metal compound of the main metal. Particularly preferred fine particles 3 are formed of an oxide or a hydroxide of a metal serving as the main component of the metal nanoparticles that form the metal grain layer 4. Oxides and hydroxides of a metal are easily bonded to the base film 1. When the metal nanoparticles that form the metal grain layer 4 contain copper as a main component, the fine particles 3 are preferably formed of copper oxide or copper hydroxide.

The lower limit of the average particle size of the fine particles 3 is preferably 0.1 nm, more preferably 0.5 nm, and still more preferably 1 nm. The upper limit of the average particle size of the fine particles 3 is preferably 20 nm, and more preferably 10 nm. When the average particle size of the fine particles 3 is less than the lower limit, the effect of improving the peel strength between the base film 1 and the metal layer 2 may be insufficiently provided. On the other hand, when the average particle size of the fine particles 3 exceeds the upper limit, the production cost of the substrate for a printed circuit board may be unnecessarily increased in order to grow the particles.

The thickness of the layer of the fine particles 3 is preferably equal to or more than the average particle size of the fine particles 3 and equal to or less than the average size of the metal grains of the metal grain layer 4. Specifically, the lower limit of the average thickness of the layer of the fine particles 3 is preferably 0.1 nm, and more preferably 0.5 nm. The upper limit of the average thickness of the layer of the fine particles 3 is preferably 100 nm, and more preferably 50 nm. When the average thickness of the layer of the fine particles 3 is less than the lower limit, the effect of improving the peel strength between the base film 1 and the metal layer 2 may be insufficiently provided. On the other hand, when the average thickness of the layer of the fine particles 3 exceeds the upper limit, separation between the base film 1 and the metal layer 2 may be easily caused by separation between the fine particles 3.

Alternatively, in the layer of the fine particles 3, the number of the fine particles 3 may decrease on the base film 1 side, that is, the density of the fine particles 3 present may gradually decrease toward the base film 1 side. Specifically, since the fine particles 3 are present so as to enter fine recessed portions or between polymer chains on a surface of the resin that forms the base film 1, the fine particles 3 can be bonded to the base film 1 more strongly, and the peel strength between the base film 1 and the metal layer 2 can be more effectively improved.

[Method for Producing Substrate for Printed Circuit Board]

Figure 2:
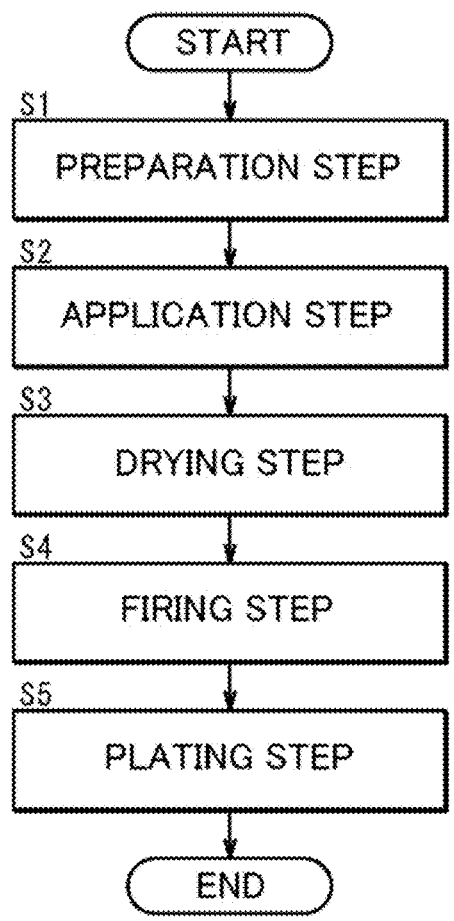
FIG. 2 is a flowchart illustrating a method for producing a substrate for a printed circuit board, the substrate being illustrated in FIG. 1.

A method for producing a substrate for a printed circuit board in FIG. 2 is a method for producing the substrate for a printed circuit board in FIG. 1.

The method for producing a substrate for a printed circuit board includes a step of preparing a conductive composition containing metal nanoparticles (step S1: preparation step), a step of applying the conductive composition prepared in the preparation step onto one surface side of a base film 1 (step S2: application step), a step of drying the conductive composition applied in the application step (step S3: drying step), a step of heat-treating the conductive composition dried in the drying step to sinter the metal nanoparticles (step S4: firing step), and a step of performing plating on one surface side of a layer formed by firing the metal nanoparticles in the firing step (step S5: plating step). The firing step of step S4 includes a step of forming a plurality of fine particles 3 between the base film 1 and a metal layer 2, the fine particles 3 being formed of a metal the same as a main metal of the metal layer 2 or formed of a metal compound of the main metal.

<Preparation Step>

In the preparation step of step S1, a dispersing agent is dissolved in a dispersion medium, and the metal nanoparticles are dispersed in the dispersion medium. Specifically, the dispersing agent surrounds the metal nanoparticles to prevent aggregation, and satisfactorily disperses the metal nanoparticles in the dispersion medium. The dispersing agent may be added to the reaction system in the form of a solution in which the dispersing agent is dissolved in water or a water-soluble organic solvent.

(Method for Producing Metal Nanoparticle)

Here, a method for producing metal nanoparticles to be dispersed in the conductive composition will be described. The metal nanoparticles can be produced by, for example, a high-temperature treatment method, a liquid-phase reduction method, or a gas-phase method. The metal nanoparticles are preferably produced by the liquid-phase reduction method, with which particles having a uniform particle size can be produced at a relatively low cost.

To produce the metal nanoparticles by the liquid-phase reduction method, for example, a dispersing agent and a water-soluble metal compound serving as a source of metal ions that are to form the metal nanoparticles are dissolved in water, and a reducing agent is added to cause a reduction reaction of the metal ions for a certain period of time. The liquid-phase reduction method can provide metal nanoparticles having a uniform spherical or granular shape and having a very small size. Examples of the water-soluble metal compound serving as the source of metal ions include, in the case of copper, copper(II) nitrate ($Cu(NO_3)_2$) and copper(II) sulfate pentahydrate ($CuSO_4.5H_2O$); in the case of silver, silver(I) nitrate ($AgNO_3$) and silver methanesulfonate ($CH_3SO_3Ag$); in the case of gold, tetrachloroauric (III) acid tetrahydrate ($HAuCl_4.4H_2O$); and, in the case of nickel, nickel(II) chloride hexahydrate ($NiCl_2.6H_2O$) and nickel(II) nitrate hexahydrate ($Ni(NO_3)_2.6H_2O$). Also for other metal nanoparticles, water-soluble compounds such as chlorides, nitrate compounds, and sulfate compounds can be used.

When the liquid-phase reduction method is used to produce metal nanoparticles, various reducing agents capable of reducing and precipitating metal ions in a liquid-phase (aqueous solution) reaction system can be used. Examples of the reducing agents include sodium borohydride, sodium hypophosphite, hydrazine, transition metal ions such as a trivalent titanium ion and a divalent cobalt ion, ascorbic acid, reducing sugars such as glucose and fructose, and polyhydric alcohols such as ethylene glycol and glycerin. Among these, a trivalent titanium ion is used in a titanium redox process, in which metal ions are reduced by a redox action during oxidation of a trivalent titanium ion into a tetravalent ion to precipitate metal nanoparticles. Metal nanoparticles obtained by the titanium redox process have a small and uniform particle size. In addition, the titanium redox process can provide metal nanoparticles having a spherical or granular shape. Therefore, use of the titanium redox process enables filling with metal nanoparticles at a higher density, and thus the metal grain layer 4 can be formed as a denser layer.

The particle size of metal nanoparticles can be adjusted by adjusting the types and mixing ratio of the metal compound, the dispersing agent, and the reducing agent, and by adjusting, for example, the stirring rate, the temperature, the time, and the pH during the reduction reaction of the metal compound. For example, the pH of the reaction system is preferably adjusted to 7 or more and 13 or less in order to obtain metal nanoparticles having a very small particle size. At this time, a pH adjuster may be used so as to adjust the pH of the reaction system to be in the above range. As the pH adjuster, a common acid or alkali such as hydrochloric acid, sulfuric acid, sodium hydroxide, or sodium carbonate may be used. In particular, in order to prevent peripheral components from deteriorating, nitric acid and ammonia, which are free from impurity elements such as alkali metals, alkaline-earth metals, halogen elements, e.g., chlorine, sulfur, phosphorus, and boron, are preferred.

When the liquid-phase reduction method is used to produce the metal nanoparticles, metal nanoparticles precipitated in a liquid-phase (aqueous solution) reaction system are subjected to steps of, for example, filtration, washing, drying, and pulverization, and the resulting powder may be used for preparing the conductive composition. In this case, the powdery metal nanoparticles, water serving as a dispersion medium, a dispersing agent, and an optional water-soluble organic solvent may be mixed with a predetermined ratio to prepare a conductive composition containing the metal nanoparticles. In this case, the liquid phase (aqueous solution) in which the metal nanoparticles are precipitated is preferably used as a starting material to prepare the conductive composition. Specifically, the liquid phase (aqueous solution) containing the precipitated metal nanoparticles is subjected to processes of, for example, ultrafiltration, centrifugation, washing with water, and electrodialysis to remove impurities and is optionally concentrated to remove water. Alternatively, water is conversely added to adjust the concentration of the metal nanoparticles, and a water-soluble organic solvent is then optionally mixed with a predetermined ratio to prepare a conductive composition containing the metal nanoparticles. This method is capable of preventing generation of coarse and irregular particles due to aggregation of the metal nanoparticles during drying. Thus, a dense and uniform metal grain layer 4 can be easily formed.

(Dispersion Medium)

As the dispersion medium of the conductive composition, water, a highly polar solvent, or a mixture of two, three or more thereof may be used. Among these, a mixture of water serving as a main component and a highly polar solvent compatible with water is suitably used.

The lower limit of the content of water serving as a main component of the dispersion medium in the conductive composition is preferably 20 parts by mass, and more preferably 50 parts by mass relative to 100 parts by mass of metal nanoparticles. The upper limit of the content of water serving as a main component of the dispersion medium in the conductive composition is preferably 1,900 parts by mass, and more preferably 1,000 parts by mass relative to 100 parts by mass of metal nanoparticles. The water in the dispersion medium sufficiently swells the dispersing agent to satisfactorily disperse the metal nanoparticles surrounded by the dispersion agent. When the content of water is less than the lower limit, this effect of swelling the dispersing agent exerted by water may be insufficiently provided. On the other hand, when the content of water exceeds the upper limit, the conductive composition has a low content of the metal nanoparticles, and a good metal grain layer 4 having required thickness and density may not be formed on a surface of the base film 1.

The organic solvent optionally added to the conductive composition may be selected from various water-soluble organic solvents. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; esters of, for example, a polyhydric alcohol such as ethylene glycol or glycerin; and glycol ethers such as ethylene glycol monoethyl ether and diethylene glycol monobutyl ether.

The lower limit of the content of the water-soluble organic solvent is preferably 30 parts by mass, and more preferably 80 parts by mass relative to 100 parts by mass of the metal nanoparticles. The upper limit of the content of the water-soluble organic solvent is preferably 900 parts by mass, and more preferably 500 parts by mass relative to 100 parts by mass of the metal nanoparticles. When the content of the water-soluble organic solvent is less than the lower limit, the effect of adjusting the viscosity of the conductive composition and adjusting the vapor pressure, the effect being exerted by the organic solvent, may be insufficiently provided. On the other hand, when the content of the water-soluble organic solvent exceeds the upper limit, the effect of swelling the dispersing agent exerted by water may be insufficiently provided, which may result in occurrence of aggregation of the metal nanoparticles in the conductive composition.

(Dispersing Agent)

The dispersing agent contained in the conductive composition is preferably free from sulfur, phosphorus, boron, halogen, and alkali from the viewpoint of preventing deterioration of the substrate for a printed circuit board. Preferred examples of the dispersing agent include amine-based polymeric dispersing agents such as polyethyleneimine and polyvinylpyrrolidone; hydrocarbon-based polymeric dispersing agents having carboxyl groups in the molecule thereof, such as polyacrylic acid and carboxymethyl cellulose; and polymeric dispersing agents having polar groups such as poval (polyvinyl alcohol), styrene-maleic acid copolymers, olefin-maleic acid copolymers, and copolymers having a polyethyleneimine moiety and a polyethylene oxide moiety in a single molecule.

The lower limit of the molecular weight of the dispersing agent is preferably 2,000, and more preferably 5,000. The upper limit of the molecular weight of the dispersing agent is preferably 300,000, and more preferably 100,000. When the molecular weight of the dispersing agent is less than the lower limit, the effect of preventing aggregation of metal nanoparticles to maintain the dispersion may be insufficiently provided. As a result, a metal grain layer 4 that is dense and has few defects may not be formed on the base film 1. On the other hand, when the molecular weight of the dispersing agent exceeds the upper limit, the dispersing agent may be excessively bulky, and during the heat treatment performed after application of the conductive composition, sintering between metal nanoparticles may be inhibited, which may result in generation of voids. In addition, in such a case, the film quality of the metal grain layer 4 may be degraded in terms of denseness, or the decomposition residue of the dispersing agent may cause a decrease in the conductivity.

The lower limit of the content of the dispersing agent in the conductive composition is preferably 1 part by mass, and more preferably 5 parts by mass relative to 100 parts by mass of the metal nanoparticles. The upper limit of the content of the dispersing agent in the conductive composition is preferably 60 parts by mass, and more preferably 40 parts by mass relative to 100 parts by mass of the metal nanoparticles. When the content of the dispersing agent is less than the lower limit, the effect of preventing aggregation may be insufficiently provided. On the other hand, when the content of the dispersing agent exceeds the upper limit, during the heat treatment performed after application of the conductive composition, the excessive dispersing agent may inhibit firing that includes sintering of the metal nanoparticles, which may result in generation of voids, or the decomposition residue of the polymeric dispersing agent may remain as impurities in the metal grain layer 4, which may result in a decrease in the conductivity.

<Application Step>

In the application step of step S2, the conductive composition containing the metal nanoparticles is applied to at least one surface of a base film 1.

Examples of the method for applying the conductive composition include conventionally known coating methods such as spin coating, spray coating, bar coating, die coating, slit coating, roll coating, and dip coating. Alternatively, the conductive composition may be applied to only a portion of one of the surfaces of the base film 1 by, for example, screen printing or using a dispenser.

<Drying Step>

In the drying step of step S3, the dispersion medium in the conductive composition applied to the base film 1 is evaporated to dry the conductive composition.

For example, natural drying, drying by heating, or drying with warm air may be employed as the method for drying the conductive composition. However, the method is one in which the conductive composition before drying does not receive a strong wind that may roughen the surface thereof.

<Firing Step>

In the firing step of step S4, the dispersion medium is thermally decomposed and the metal nanoparticles are combined together by heating to form a metal grain layer 4. Sintering the metal nanoparticles in this manner enables the metal grain layer 4 and the metal layer 2 to be relatively easily formed on the surface of the base film 1.

This firing step includes a step of forming a plurality of fine particles 3 so as to dispose between the base film 1 and the metal layer 2. Specifically, in the firing step, at least some of the fine particles 3 disposed between the base film 1 and the metal layer 2 are formed in parallel with combining of the metal nanoparticles. Since metal nanoparticles have a large surface area and easily react with surrounding substances, the metal nanoparticles easily generate fine particles.

The fine particles 3 are formed of the main metal of the metal nanoparticles or an oxide or a hydroxide of the main metal. Since the fine particles 3 have high affinity with the base film 1 formed of a resin, the fine particles 3 are mainly formed at the interface between the base film 1 and the layer of the metal nanoparticles. Therefore, when a large number of fine particles 3 are formed, the fine particles 3 are in a state in which they are present so as to form a layer between the base film 1 and the metal grain layer 4 formed by firing the metal nanoparticles. The fine particles 3 thus formed and disposed between the base film 1 and the metal grain layer 4 (the metal layer 2) have relatively high adhesiveness to the base film 1 and the metal grain layer 4 to thereby increase the peel strength between the base film 1 and the metal layer 2.

In a specific example, when copper is used for the metal nanoparticles, fine particles 3 formed of copper oxide and fine particles 3 formed of copper hydroxide are generated mainly near the interface of the layer of the metal nanoparticles with the base film 1, and the fine particles 3 formed of copper oxide are preferably generated in a larger amount. Of these, fine particles formed of copper oxide are easily combined with the resin that forms the base film 1, and therefore increase adhesion strength between the metal grain layer 4 and the base film 1.

The treatment temperature in this firing step, that is, the sintering temperature of metal nanoparticles is selected in accordance with the types of metal nanoparticles and dispersing agent. Specifically, the lower limit of the sintering temperature of the metal nanoparticles is preferably 260° C., and more preferably 300° C. The upper limit of the sintering temperature of the metal nanoparticles is preferably 400° C., and more preferably 380° C. When the sintering temperature of the metal nanoparticles is less than the lower limit, generation of the fine particles 3 may not occur. On the other hand, when the sintering temperature of the metal nanoparticles exceeds the upper limit, the base film 1 may be deformed or damaged.

The heat treatment in the firing step is preferably performed in an atmosphere in which a certain amount of oxygen is contained. The lower limit of the oxygen concentration of the atmosphere during the heat treatment is preferably 10 ppm by volume, and more preferably 100 ppm by volume. The upper limit of the oxygen concentration of the atmosphere during the heat treatment is preferably 500 ppm by volume, and more preferably 400 ppm by volume. When the oxygen concentration of the atmosphere during the heat treatment is less than the lower limit, the amount of fine particles 3 generated decreases, and the effect of improving adhesion strength between the base film 1 and the metal layer 2 may be insufficiently provided. On the other hand, when the oxygen concentration of the atmosphere during the heat treatment exceeds the upper limit, the metal nanoparticles are oxidized and the fine particles 3 may not be generated, which may result in insufficient adhesive strength between the base film 1 and the metal layer 2.

<Plating Step>

In the plating step of step S5, a plating layer 5 is formed by electroless plating or electroplating on a surface of the metal grain layer 4 formed in the firing step of step S4, the surface being opposite to the base film 1.

In this plating step, when electroless plating is used to form the plating layer 5, the metal used in the electroless plating may be, for example, copper, nickel, or silver, as described above. For example, when copper plating is performed, a copper plating solution containing a very small amount of nickel is used as a copper plating solution used in the electroless plating. Use of a copper plating solution containing nickel or a nickel compound enables a plating layer 5 having low stress to be formed. The copper plating solution preferably contains, for example, 0.1 moles or more and 60 moles or less of nickel relative to 100 moles of copper. The copper plating solution may optionally contain other components such as a complexing agent, a reducing agent, and a pH adjuster.

In the electroless plating, palladium may be used as a precipitation catalyst of a plating metal. In the case where palladium is used as a precipitation catalyst, in an activator step, the surface of the metal grain layer 4 is brought into contact with a palladium chloride solution to thereby cause palladium ions to adsorb on the surface of the metal grain layer 4, and in a reduction step, the palladium ions adsorbing on the metal grain layer 4 are reduced to metal palladium. In the case where, for example, electroless copper plating is performed, in a chemical copper step, for example, the resulting base film is immersed in an aqueous solution containing copper sulfate and formalin to thereby form a copper coating film on the surface of the metal grain layer 4 while palladium functions as a catalyst. In the case where, for example, electroless nickel plating is performed, in a chemical nickel step, for example, the resulting base film is immersed in an aqueous solution containing nickel sulfate and sodium hypophosphite to thereby form a nickel coating film on the surface of the metal grain layer 4 while palladium functions as a catalyst.

When the metal layer 2 is required to have an average thickness of, for example, 1 μm or more, electroplating is used to form the plating layer 5, or after electroless plating is performed, electroplating is further performed until the metal layer has a required thickness. This electroplating can be performed so as to rapidly form a metal layer having a predetermined thickness without defects by using a conventionally known electroplating bath in accordance with a metal to be plated, such as copper, nickel, or silver, and by selecting appropriate conditions.

[Printed Circuit Board]

The printed circuit board is produced by forming a conductive pattern in the substrate for a printed circuit board in FIG. 1. The conductive pattern is formed in the metal layer 2 of the substrate for a printed circuit board, the metal layer 2 functioning as a base, by a subtractive method or a semi-additive method.

For example, in the subtractive method, a photosensitive resist is formed so as to cover a surface of the substrate for a printed circuit board, the surface having the metal layer 2 thereon. The resist is patterned so as to correspond to a conductive pattern by, for example, exposure and development. Subsequently, portions of the metal layer 2 other than the conductive pattern are removed by etching using the pattered resist as a mask. Lastly, the remaining resist is removed to thereby provide a printed circuit board including the base film having a conductive pattern thereon.

In the semi-additive method, a photosensitive resist is formed so as to cover a surface of the substrate for a printed circuit board, the surface having the metal layer 2 thereon. The resist is patterned so as to form openings corresponding to a conductive pattern by, for example, exposure and development. Subsequently, plating is performed by using the patterned resist as a mask to selectively form a conductor layer on the metal layer 2 exposed on the openings of the mask. Subsequently, the resist is removed, and the surface of the conductor layer and portions of the metal layer 2, the portions not having the conductor layer thereon, are then removed by etching to thereby provide a printed circuit board including the base film having a conductive pattern thereon.

The printed circuit board formed by using the substrate for a printed circuit board has a sufficiently small thickness so as to satisfy the requirements for a high-density printed circuit, has a good etching property, and has high adhesion strength between the base film 1 and the metal layer 2, so that the conductive patter is less likely to separate from the base film 1.

[Advantages]

According to the substrate for a printed circuit board, the substrate being produced by the method for producing a substrate for a printed circuit board, a plurality of fine particles 3 having high adhesiveness with the base film 1 and the metal layer 2 are disposed between the base film 1 and the metal layer 2. Therefore, the substrate for a printed circuit board has high peel strength between the base film 1 and the metal layer 2.

In addition, according to the substrate for a printed circuit board, peel strength between the base film 1 and the metal layer 2 is improved by the plurality of fine particles 3 instead of engaging a metal in the base film 1, and thus, a good etching property of the metal layer 2 and the fine particles 3 is exhibited. Therefore, according to the substrate for a printed circuit board, the metal layer 2 and the fine particles 3 can be easily removed by etching. The substrate for a printed circuit board realizes production of a printed circuit board with a high accuracy.

[Other Embodiments]

It is to be understood that the embodiments disclosed herein are only illustrative and are not restrictive in all respects. The scope of the present invention is not limited to the configurations of the embodiments and is defined by the claims described below. The scope of the present invention is intended to cover all the modifications within the meaning and range of equivalents of the claims.

The fine particles in the substrate for a printed circuit board may be formed of a compound containing an element other than a metal element, oxygen, and hydrogen.

In the substrate for a printed circuit board, the fine particles may be discontinuously disposed between the base film and the metal layer without clearly forming a layer.

The substrate for a printed circuit board may not include a plating layer. Accordingly, the plating step in the method for producing a substrate for a printed circuit board may be omitted. In the case where, for example, the substrate for a printed circuit board is used to form a printed circuit board by the semi-additive method, since the metal layer may have a small thickness, omission of the plating layer is considered.

The method for producing a substrate for a printed circuit board may include an annealing step after the plating step. Fine particles can be grown by conducting the annealing step. Accordingly, for example, the particle size of the fine particles can be adjusted by adjusting the treatment temperature and the time in the annealing step.

The lower limit of the treatment temperature of the annealing step is preferably 260° C., and more preferably 300° C. The upper limit of the treatment temperature of the annealing step is preferably 400° C., and more preferably 380° C. When the treatment temperature of the annealing step is less than the lower limit, fine particles may not be grown. On the other hand, when the treatment temperature of the annealing step exceeds the upper limit, for example, the base film may be damaged.

The lower limit of the treatment time of the annealing step is preferably 10 minutes, and more preferably 30 minutes. The upper limit of the treatment time of the annealing step is preferably 720 minutes, and more preferably 360 minutes. When the treatment time of the annealing step is less than the lower limit, fine particles may not be sufficiently grown. On the other hand, when the treatment time of the annealing step exceeds the upper limit, fine particles may corrode the metal layer, or the production cost of the substrate for a printed circuit board may be unnecessarily increased.

In the method for producing a substrate for a printed circuit board, the metal layer may be formed without using metal nanoparticles.

EXAMPLES

The present invention will now be described in detail on the basis of results of trial production of substrates for printed circuit boards. The present invention is not limitedly interpreted on the basis of the description of the trial products.

<Trial Products>

In order to confirm the effects of the present invention, Trial products 1 to 5 of substrates for printed circuit boards were produced under different conditions.

(Trial Product 1)

In Trial product 1, a polyimide film "Apical (registered trademark) 25NPI" manufactured by Kaneka Corporation and having a thickness of 25 µm was used as a base film, and a conductive composition prepared by dispersing, as metal nanoparticles, copper particles having an average particle size of 64 nm in a concentration of 26% by mass in water was used to form a metal grain layer and fine particles. Specifically, the conductive composition was applied to a surface of the base film (application step) and dried in air. Subsequently, heat treatment (firing step) was conducted by heating the resulting base film in a nitrogen gas atmosphere at a temperature of 350° C. in an oxygen concentration of 100 ppm by volume for 30 minutes. That is, through this heat treatment, the metal nanoparticles were fired to form a metal grain layer and to form fine particles disposed between the base film and the metal grain layer. Subsequently, copper electroless plating (plating step) was conducted on the surface of the formed metal grain layer so that an average thickness became 0.4 µm. Copper electroplating was further conducted to form a metal layer having an average total thickness of 18 µm. Furthermore, the base film having the metal layer thereon was subjected to an annealing treatment at a temperature of 350° C. for 30 minutes to obtain Trial product 1.

(Trial Product 2)

Trial product 2 was produced under the same conditions as those in Trial product 1 except that copper particles having an average particle size of 102 nm were used as the metal nanoparticles.

(Trial Product 3)

Trial product 3 was produced under the same conditions as those in Trial product 1 except that copper particles having an average particle size of 38 nm were used as the metal nanoparticles.

(Trial Product 4)

Trial product 4 was produced under the same conditions as those in Trial product 1 except that copper particles having an average particle size of 455 nm were used as the metal nanoparticles.

(Trial Product 5)

Trial product 5 was produced under the same conditions as those in Trial product 1 except that the firing time was changed to 600 minutes.

<Evaluations>

With regard to Trial products 1 to 5, evaluations were conducted as follows.

(Photographing of Section)

Photographs of sections of the substrates of Trial products 1 to 5 for printed circuit boards were taken by using a transmission electron microscope "JEM-2100F" manufactured by JEOL Ltd.

Figure 3A:
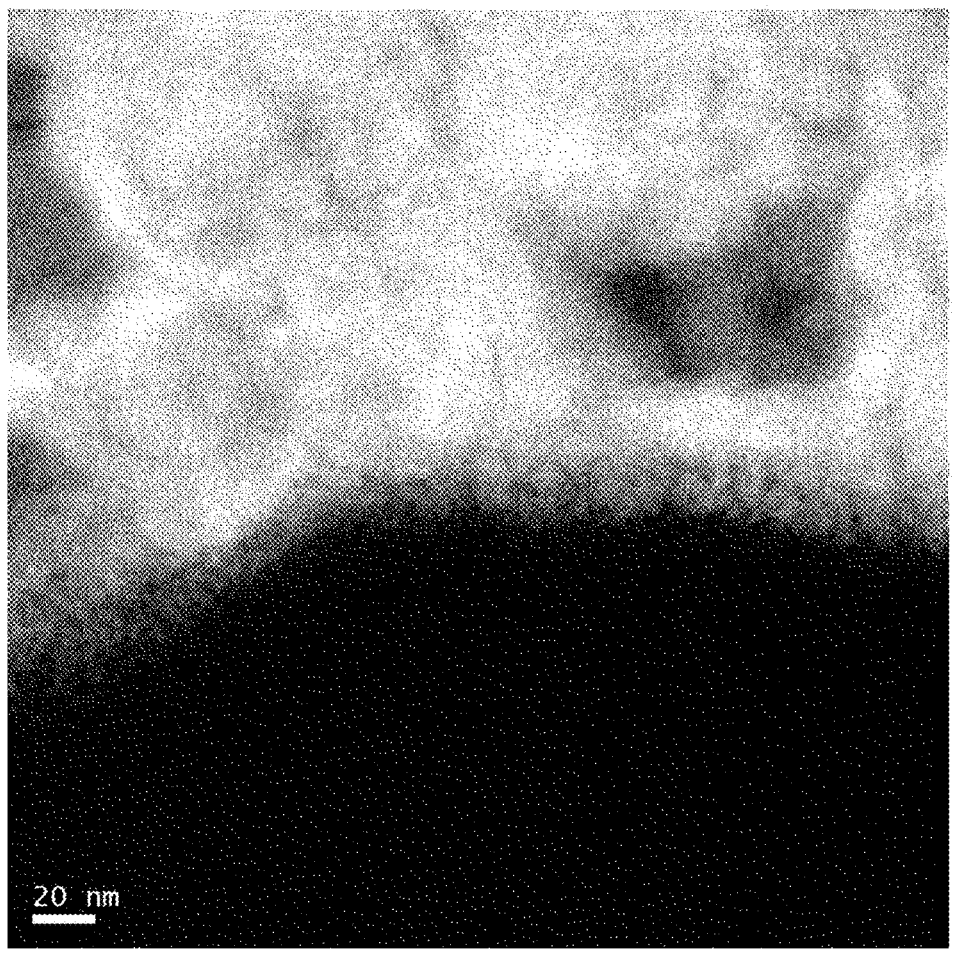
FIG. 3A is an electron micrograph of a section of Trial product 1.
Figure 3B:
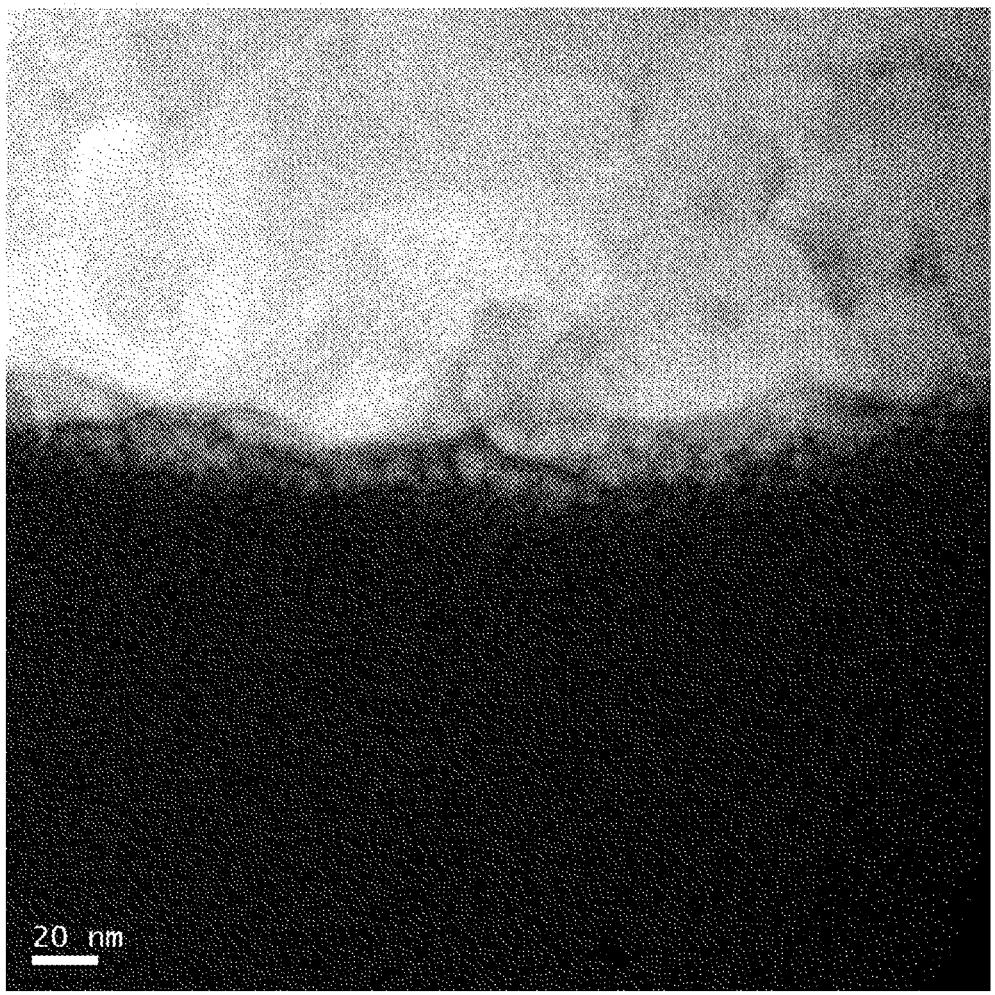
FIG. 3B is an electron micrograph of a section of Trial product 2.
Figure 3C:
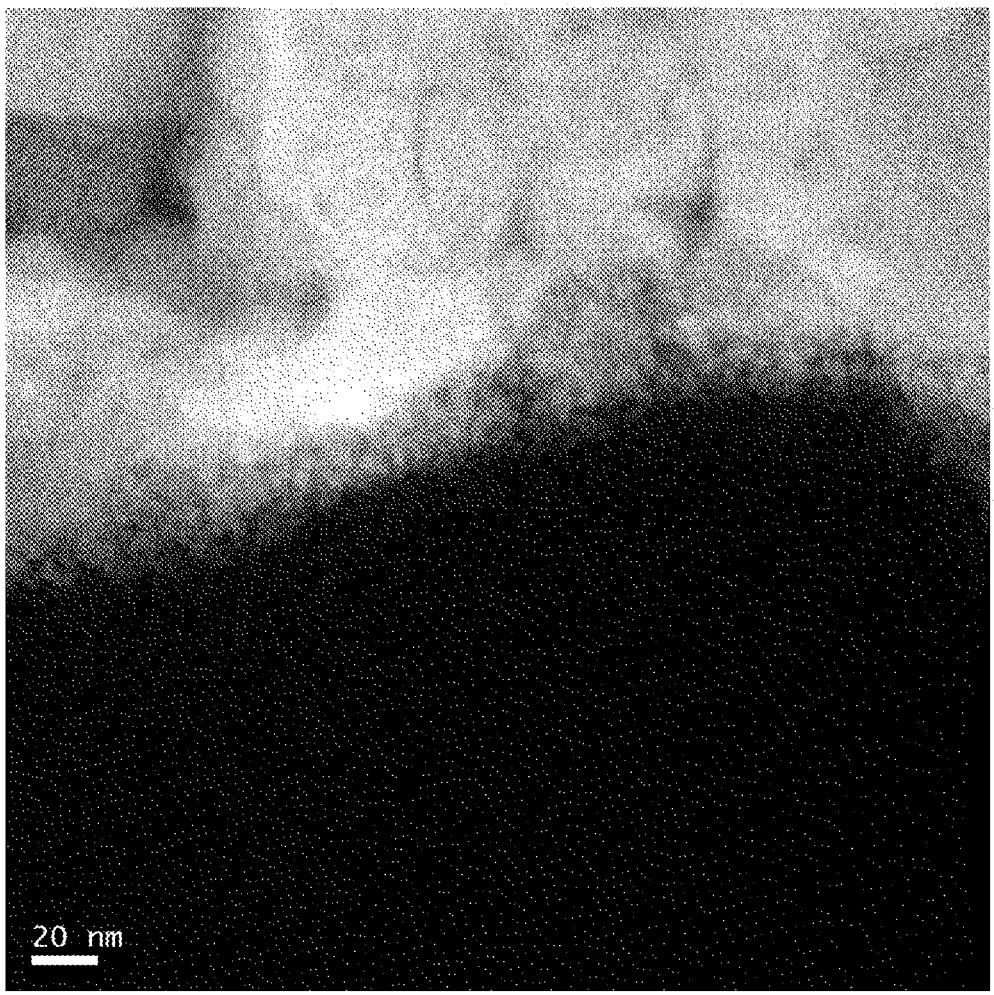
FIG. 3C is an electron micrograph of a section of Trial product 3.

FIGS. 3A to 3C show images of the sections of the substrates of Trial products 1 to 3 for printed circuit boards, respectively, the images being taken with the transmission electron microscope.

In each of the images, the lower dark portion shows a base film, and the upper light portion shows a metal grain layer. In the metal grain layer, crystal grains having a size of about several tens of nanometers to several hundreds of nanometers are confirmed. In the middle of each of the images in the up-down direction, it is confirmed that fine particles having a particle size of about several nanometers are present between the base film and the metal grain layer so as to form a layer. That is, in each of Trial products 1 to 3, fine particles disposed between the base film and the metal layer are formed.

(Average Particle Size)

In each of the images, an average particle size was calculated by averaging measured values of the diameters of 10 or more fine particles.

(Element Concentration)

A section of each of the substrates of Trial products 1 to 5 for printed circuit boards was analyzed by using an energy-dispersive X-ray analysis function of the transmission electron microscope used in the photographing of the sections at an acceleration voltage of 3 kV to determine the contents of copper, carbon, and oxygen in a region near the interface between the base film and the metal layer. In the two-dimensional mapping images shown in FIGS. 4A to 6C, the content of an atom (atomic percent) is shown in a step-by-step manner by the light and shade of the color. The images show that the darker the color is, the smaller the content is, and at the lighter the color is, the larger the content is.

Figure 4A:
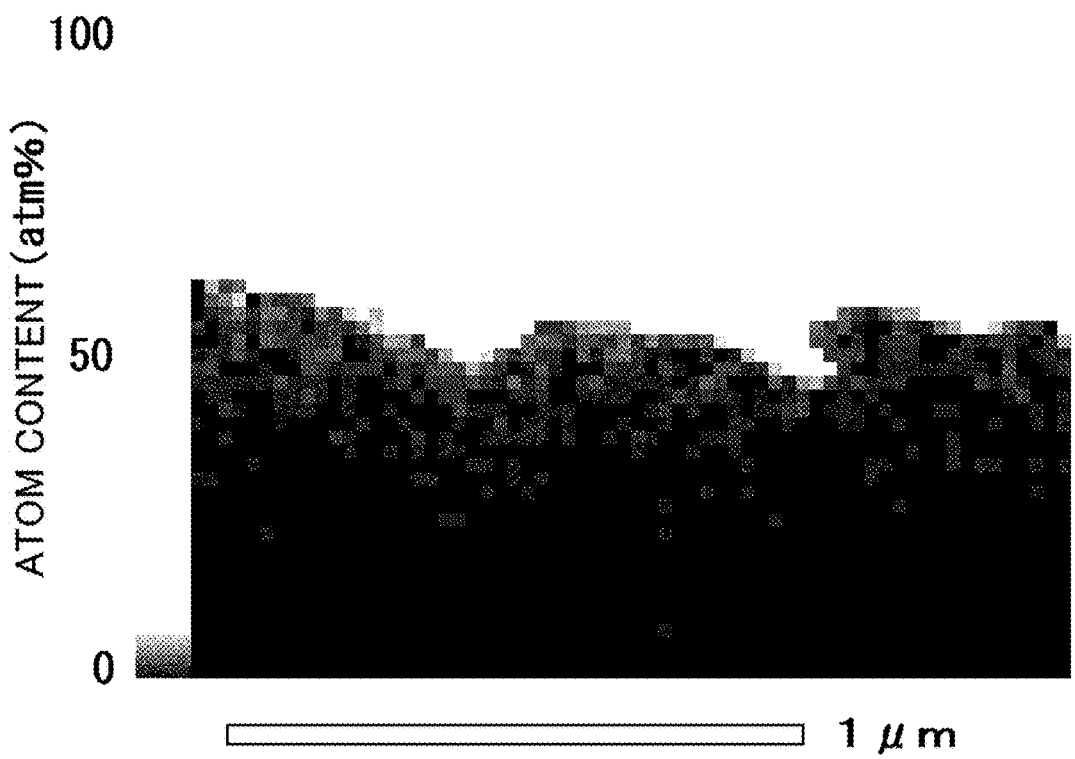
FIG. 4A is a mapping image of a copper element content of a section of Trial product 1.
Figure 4B:
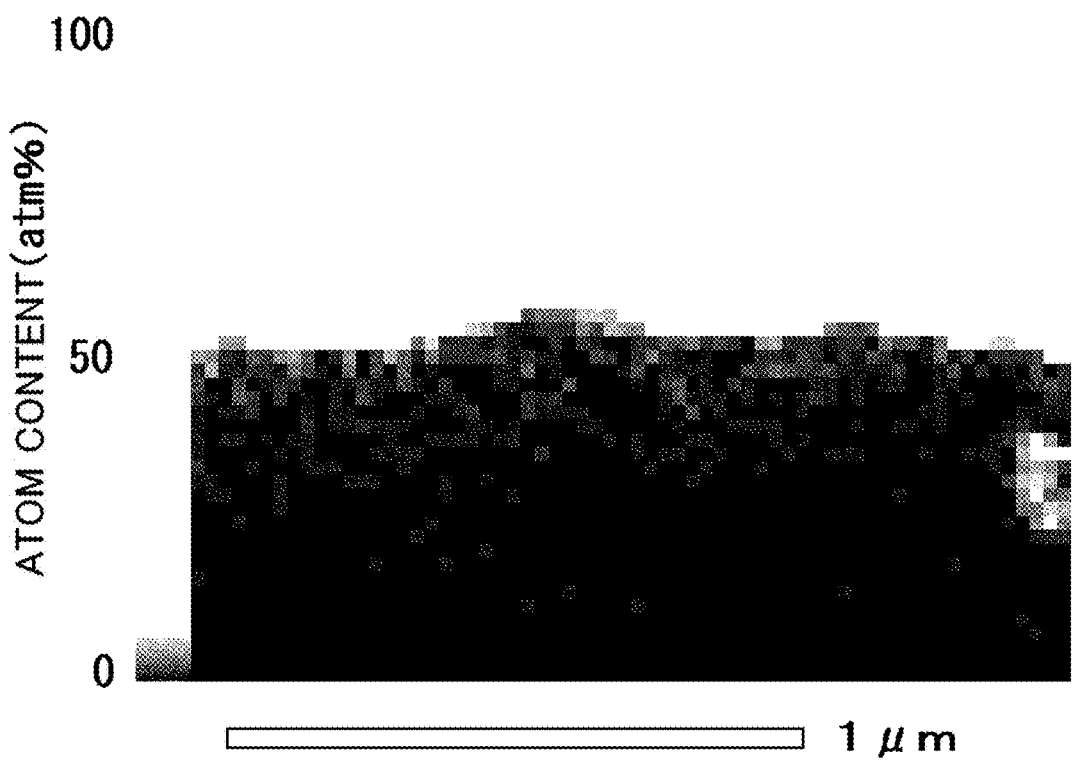
FIG. 4B is a mapping image of a copper element content of a section of Trial product 2.
Figure 4C:
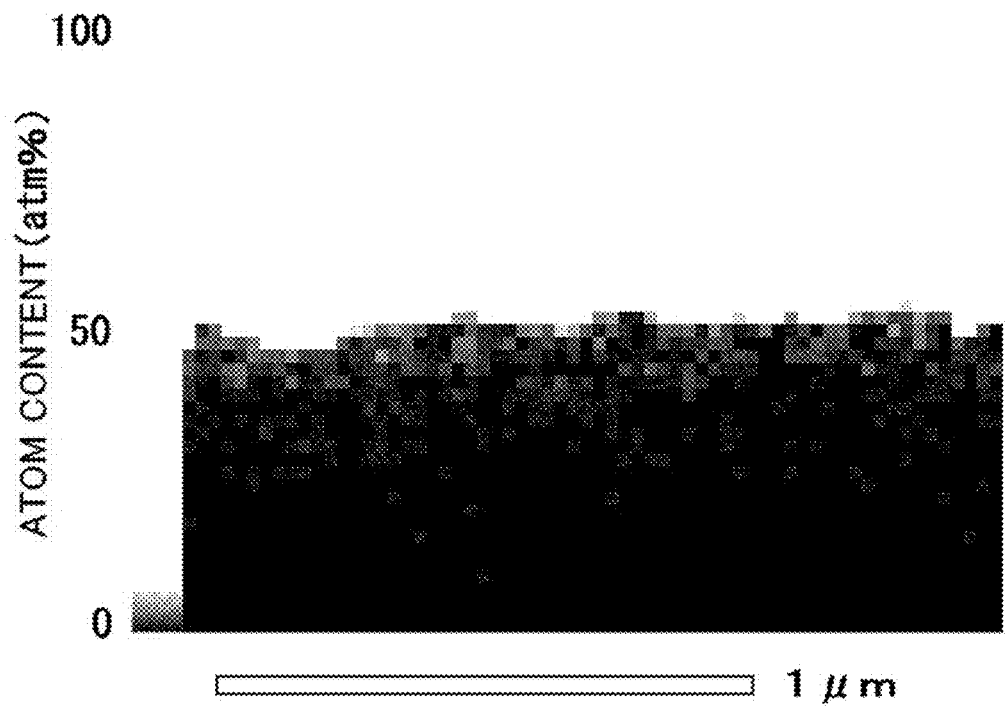
FIG. 4C is a mapping image of a copper element content of a section of Trial product 3.

FIGS. 4A to 4C respectively show two-dimensional mapping images of analysis results of the copper contents of the sections of the substrates of Trial products 1 to 3 for printed circuit boards.

The mapping of the copper content shows a region where a metal layer or fine particles are present in each of Trial products 1 to 3.

Figure 5A:
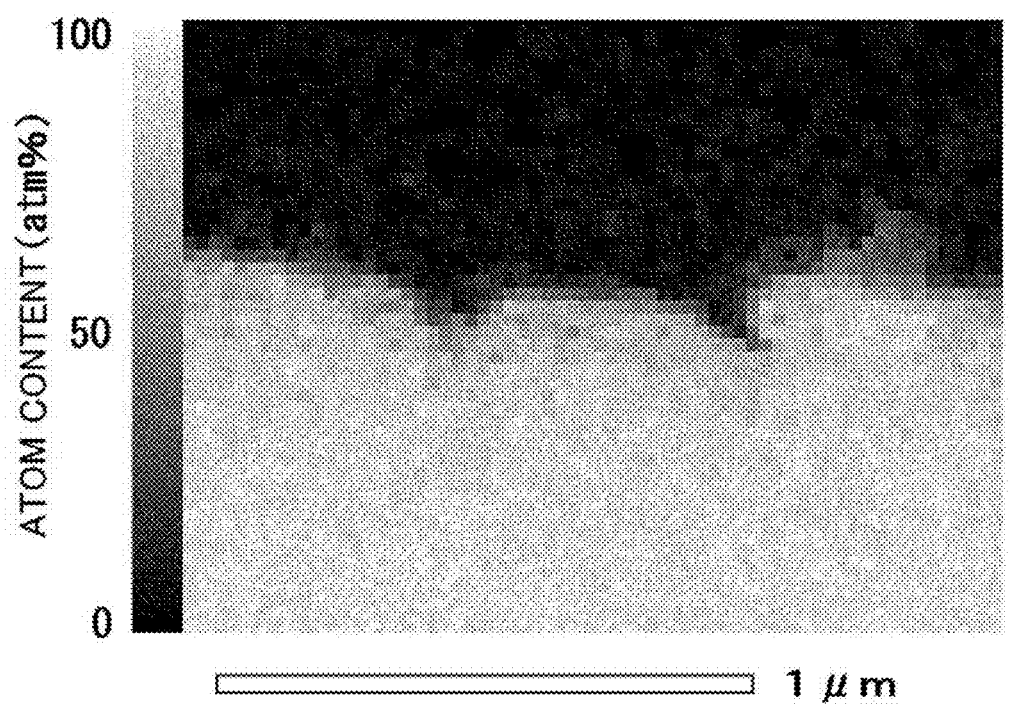
FIG. 5A is a mapping image of a carbon content of a section of Trial product 1.
Figure 5B:
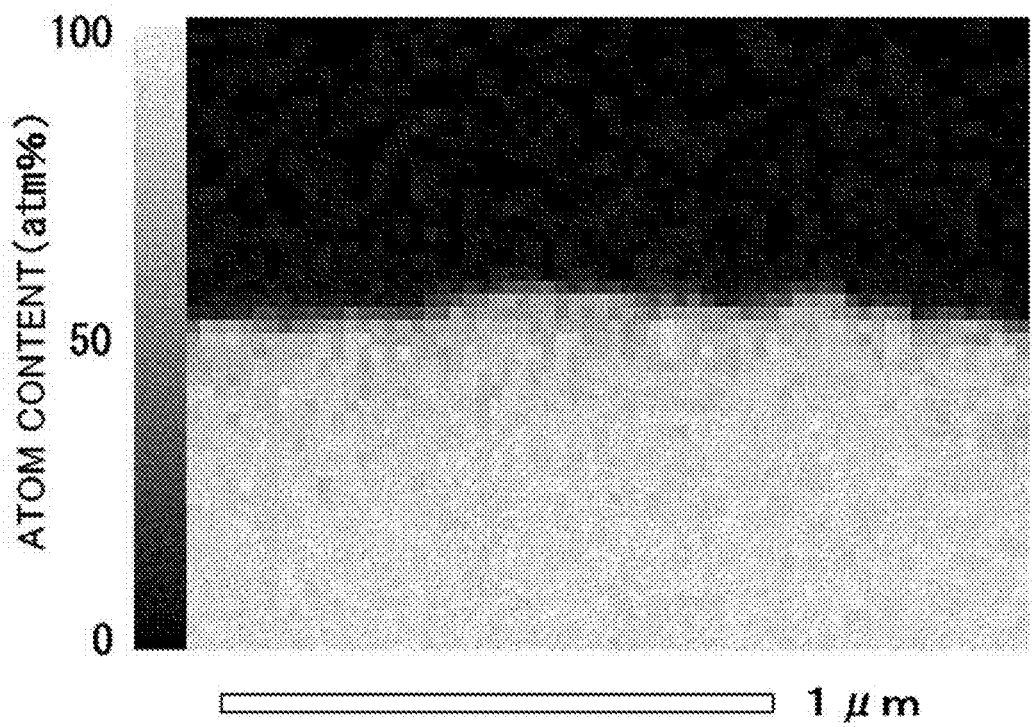
FIG. 5B is a mapping image of a carbon content of a section of Trial product 2.
Figure 5C:
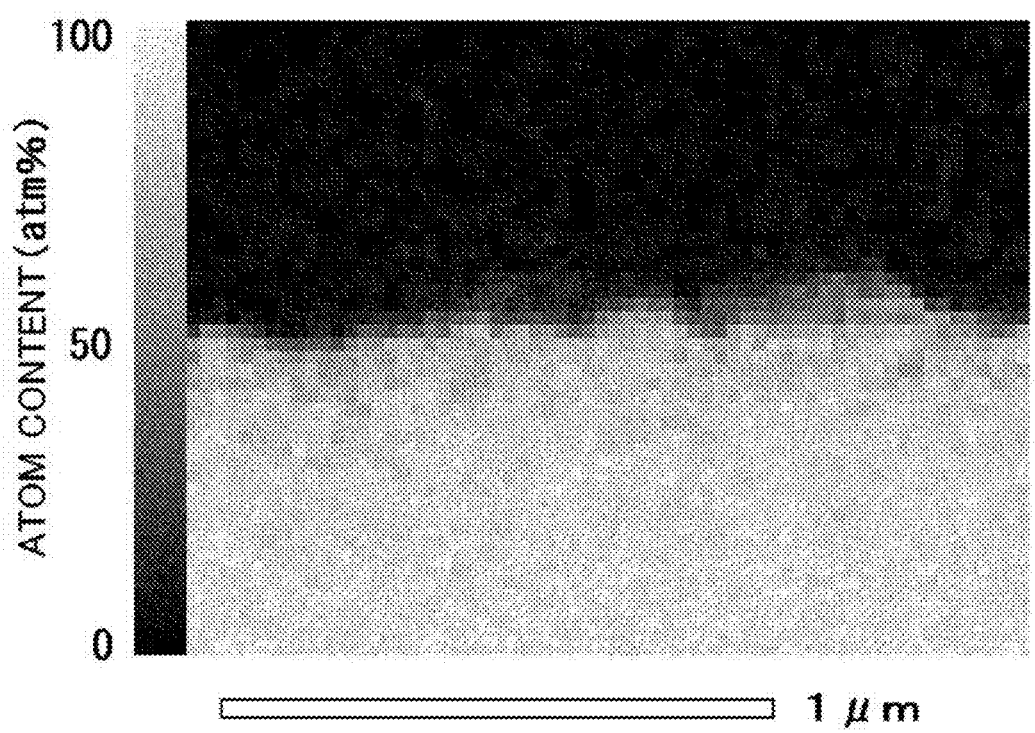
FIG. 5C is a mapping image of a carbon content of a section of Trial product 3.

FIGS. 5A to 5C respectively show two-dimensional mapping images of analysis results of the carbon contents of the sections of the substrates of Trial products 1 to 3 for printed circuit boards.

The mapping of the carbon content shows a region where a base film is present in each of Trial products 1 to 3.

Figure 6A:
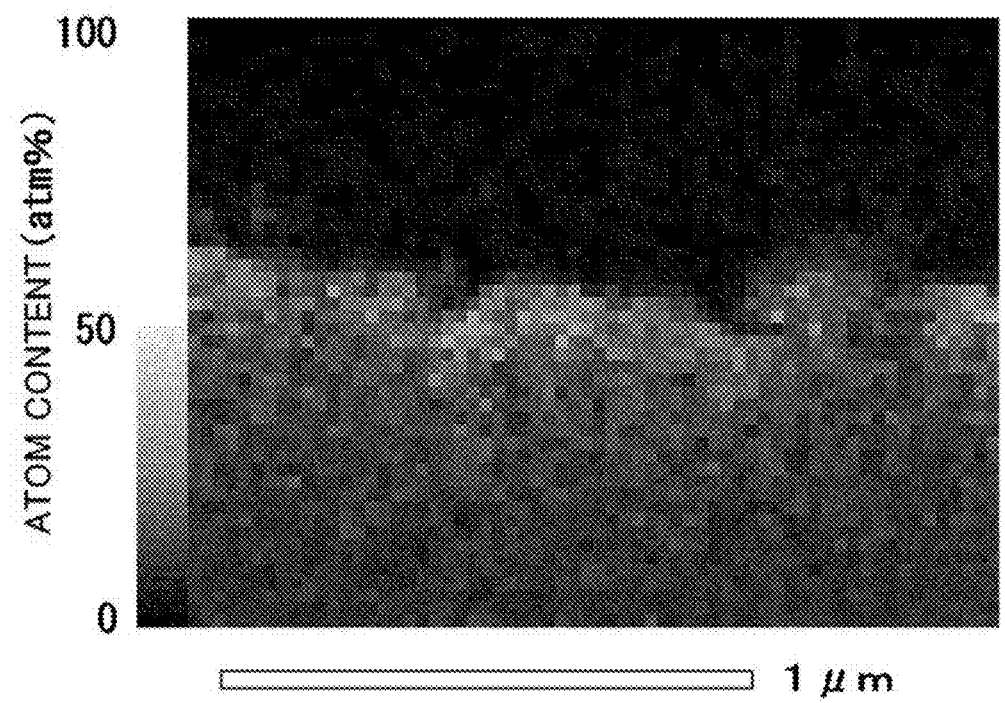
FIG. 6A is a mapping image of an oxygen content of a section of Trial product 1.
Figure 6B:
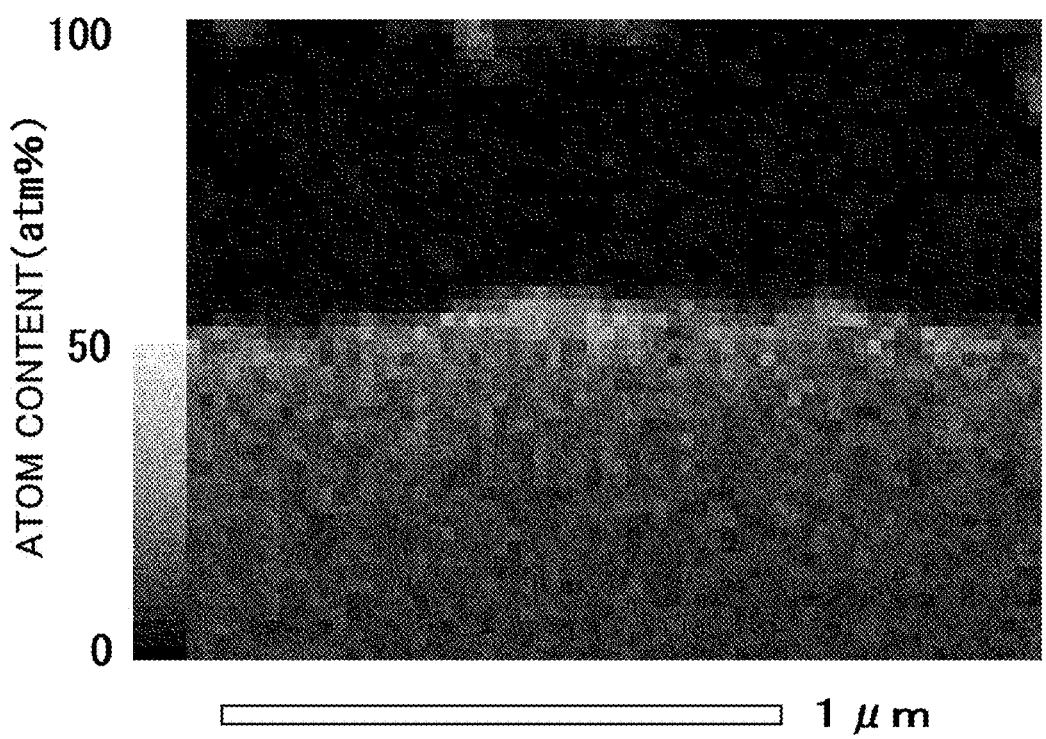
FIG. 6B is a mapping image of an oxygen content of a section of Trial product 2.
Figure 6C:
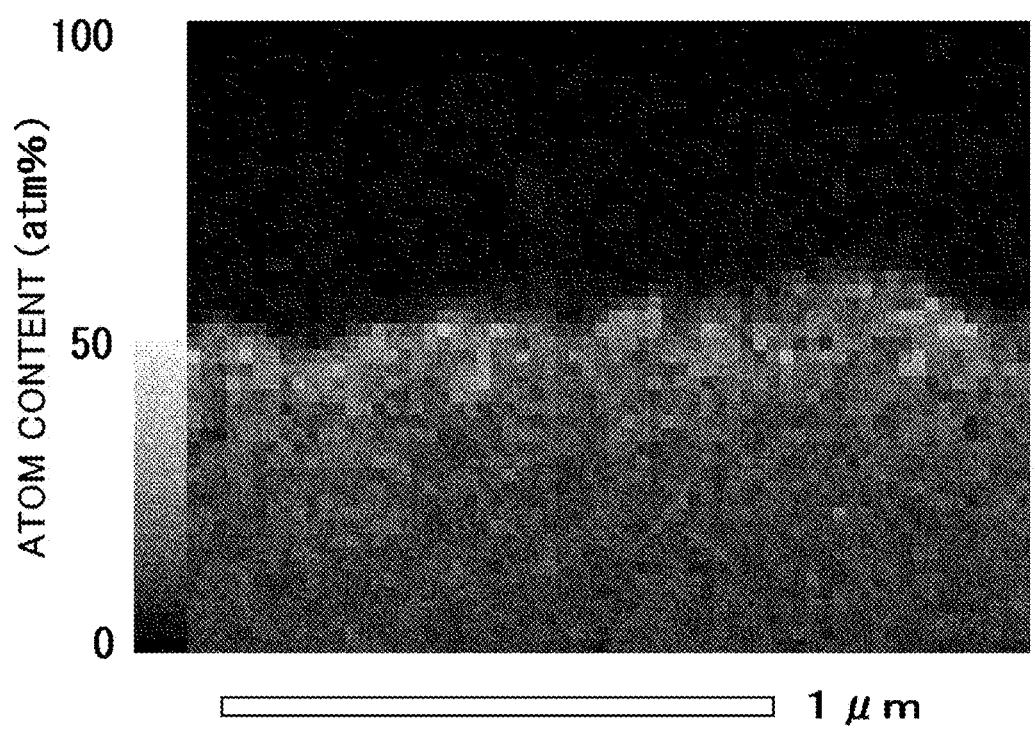
FIG. 6C is a mapping image of an oxygen content of a section of Trial product 3.

FIGS. 6A to 6C respectively show two-dimensional mapping images of analysis results of the oxygen contents of the sections of the substrates of Trial products 1 to 3 for printed circuit boards.

When the mapping of the oxygen content is superimposed on the mapping of the copper content and the mapping of the carbon content, it is found that the fine particles contain oxygen and are formed of a metal oxide or a metal hydroxide, and that oxygen is contained near the surface of the base film.

(Oxygen Content in Region Near Surface)

On the basis of the above analysis results of the oxygen content, an oxygen content (average of mapping data) in a region near the surface of the base film, that is, in a range from the surface of the base film to a depth of 50 nm was calculated for each of the substrates of Trial products 1 to 5 for printed circuit boards.

(Peel Strength)

Furthermore, with regard to the substrates of Trial products 1 to 5 for printed circuit boards, peel strength of the metal layer from the base film was measured in accordance with JIS-C6471 (1995) by a method in which the metal layer was peeled off in the 180°-direction with respect to a polyimide film. Note that a peel strength of 700 gf/cm or more is considered to be sufficient for a substrate for a printed circuit board.

With regard to the substrates of Trial products 1 to 5 for printed circuit boards, Table 1 below summarizes the measuring results of the average particle size of fine particles, the oxygen content in a region near the surface (a range from the surface to a depth of 50 nm) of the base film, and the peel strength of the metal layer from the base film.

TABLE 1

|  | Average particle size (nm) | Oxygen content (atm %) | Peel strength (gf/cm) |
| --- | --- | --- | --- |
| Trial product 1 | 1 | 22 | 820 |
| Trial product 2 | 10 | 27 | 900 |
| Trial product 3 | 5 | 24 | 750 |
| Trial product 4 | 8 | 32 | 740 |
| Trial product 5 | 18 | 46 | 880 |

<Evaluation Results>

As shown in Table 1, the substrates of Trial products 1 to 5 for printed circuit boards each have a sufficiently high peel strength of 740 gf/cm or more between the base film and the metal layer, as a result of formation of the fine particles between the base film and the metal layer. In contrast, although not shown in Table 1, in a substrate for a printed circuit board, the substrate being produced under the same conditions as those in Trial product 1 except that the sintering temperature and the oxygen concentration of the atmosphere in the firing step were adjusted so as not to form fine particles between a base film and a metal layer, the peel strength between the base film and the metal layer was low, that is, less than 700 gf/cm. These results show that a plurality of fine particles disposed between the base film and the metal layer improve the peel strength between the base film and the metal In the substrates of Trial products 1 to 5 for printed circuit boards, the fine particles formed between the base film and the metal layer had an average particle size of 1 to 18 nm. It is believed that, in each of the trial products, since a plurality of fine particles disposed between the base film and the metal layer have an average particle size of 0.1 nm or more and 20 nm or less, the peel strength of the metal layer is improved.

Furthermore, in each of the substrates of Trial products 1 to 5 for printed circuit boards, the oxygen content in a region near the surface (a range from the surface to a depth of 50 nm) of the base film is 20 atomic percent or more and 60 atomic percent or less, which is believed to further improve the adhesiveness to the fine particles.

INDUSTRIAL APPLICABILITY

The substrate for a printed circuit board and the method for producing a substrate for a printed circuit board according to the present invention achieve a good etching property and high peel strength of the metal layer, and thus are suitably used for producing printed circuit boards that are required to have high-density printed circuits.

REFERENCE SIGNS LIST 1 base film 2 metal layer 3 fine particle 4 metal grain layer
5 plating layer
S1 preparation step S2 application step S3 drying step
S4 firing step S5 plating step

The invention claimed is:

1. A substrate for a printed circuit board, comprising:
a base film having an insulating property; and
a metal layer formed on at least one surface side of the base film,
wherein a plurality of fine particles are disposed between the base film and the metal layer so as to adhere to both the base film and the metal layer, and
the fine particles are formed of a metal the same as a main metal of the metal layer or formed of a metal compound of the main metal,
wherein the fine particles are formed of a metal oxide or a metal hydroxide, and have an average particle size of 0.1 nm or more and 20 nm or less.

2. The substrate for a printed circuit board according to claim 1, wherein the fine particles are present between the base film and the metal layer so as to form a layer.

3. The substrate for a printed circuit board according to claim 1, wherein the metal layer includes a metal grain layer formed by firing metal nanoparticles.

4. The substrate for a printed circuit board according to claim 3, wherein the metal layer further includes a plating layer on one surface side of the metal grain layer, the plating layer being formed by electroless plating or electroplating.

5. The substrate for a printed circuit board according to claim 1, wherein the main metal is copper.

6. The substrate for a printed circuit board according to claim 1, wherein an oxygen content in a region of the base film, the region extending from a surface on the metal layer side to a depth of 50 nm, is 20 atomic percent or more and 60 atomic percent or less.

7. A method for producing a substrate for a printed circuit board,
the substrate including a base film having an insulating property, and
a metal layer formed on at least one surface side of the base film, the method comprising:
a step of applying a conductive composition containing metal nanoparticles onto one surface side of the base film; and
a step of firing the applied conductive composition,
wherein the firing step includes a step of forming a plurality of fine particles between the base film and the metal layer so as to adhere to both the base film and the metal layer, the fine particles being formed of a metal the same as a main metal of the metal layer or formed of a metal compound of the main metal,
wherein the fine particles are formed of a metal oxide or a metal hydroxide, and have an average particle size of 0.1 nm or more and 20 nm or less.

* * * * *